United States Patent
Venerus et al.

(10) Patent No.: US 12,212,326 B2
(45) Date of Patent: Jan. 28, 2025

(54) WIRELESS TRANSMITTER WITH IMPROVED DATA RATE

(71) Applicant: Apple Inc., Cupertino, CA (US)

(72) Inventors: Christian Venerus, San Diego, CA (US); Utku Seckin, San Jose, CA (US); Vikram Magoon, La Jolla, CA (US)

(73) Assignee: Apple Inc., Cupertino, CA (US)

( * ) Notice: Subject to any disclaimer, the term of this patent is extended or adjusted under 35 U.S.C. 154(b) by 67 days.

(21) Appl. No.: 18/110,246

(22) Filed: Feb. 15, 2023

(65) Prior Publication Data

US 2024/0275391 A1 Aug. 15, 2024

(51) Int. Cl.
*H03L 7/093* (2006.01)
*H04L 27/20* (2006.01)

(52) U.S. Cl.
CPC .......... *H03L 7/093* (2013.01); *H04L 27/2082* (2013.01)

(58) Field of Classification Search
CPC ............................ H03L 7/093; H04L 27/2082
See application file for complete search history.

(56) References Cited

U.S. PATENT DOCUMENTS 8,023,557 B2 9/2011 Constantinidis et al.
10,826,738 B2 * 11/2020 Pan ....................... H03F 1/0277

FOREIGN PATENT DOCUMENTS

WO 2008091230 A1 7/2008
WO 2017030755 A1 2/2017

* cited by examiner

*Primary Examiner* — Jeffrey M Shin
(74) *Attorney, Agent, or Firm* — FLETCHER YODER PC (57) ABSTRACT

This disclosure is directed to a transmitter including a phase locked loop (PLL), a modulator, and a power amplifier (PA). A controller including programmable and/or hardened logic circuitry may be coupled to the PLL and the modulator. The controller may provide encoded signals based on quadrature phase shift keying (QPSK) scheme for transmission by the transmitter. In particular, the controller may provide multiple bursts of pulses indicative of data packets to the modulator. Moreover, the controller may provide instructions indicative of generating clock signals with in-phase and quadrature phases to the PLL. The PLL may generate clock signals corresponding to the in-phase and quadrature phases. As such, the transmitter may generate in-phase and quadrature output signals based on receiving each burst of pulses with either in-phase or quadrature phases.

20 Claims, 9 Drawing Sheets

WIRELESS TRANSMITTER WITH IMPROVED DATA RATE

BACKGROUND

The present disclosure relates generally to wireless communication, and more specifically to data transmission with improved throughput.

In an electronic device, a transmitter may be coupled to one or more antennas to enable the electronic device to transmit wireless signals. The transmitter may include digital pulse generators to generate data signals at radio frequency (RF) frequency. The transmitter may also include a power amplifier (PA) amplifying the data signals based on receiving clock signals based on the RF frequency. As such, the one or more antennas may transmit the wireless signals based on the amplified data signals. Increasing a data rate of the transmitter for outputting the data signals is desired.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

In one embodiment, a transmitter includes a phase locked loop. The phase locked loop may include a multiphase oscillator outputting a first clock signal with a first phase and a second clock signal having a second phase. Additionally, the phase locked loop may include a multiplexer coupled to the multiphase oscillator, the multiplexer outputting the first clock signal or the second clock signal. The transmitter may also include a modulator coupled to the multiplexer, the modulator generating first output data signal with the first phase based on the first clock signal and generating second output data signal with the second phase based on the second clock signal. Further, the transmitter may include a power amplifier coupled to the multiplexer and the modulator, the power amplifier generating a first amplified output data signal based on the first output data signal, the power amplifier generating a second amplified output data signal based on the second output data signal.

In another embodiment, a method includes outputting, by a controller, a first plurality of outgoing pulses, each pulse of the first plurality of outgoing pulses having one of three pulse values. The method may also include outputting, by the controller, a first plurality of phase pulses indicative of a phase of the first plurality of outgoing pulses, each phase pulse of the first plurality of phase pulses having a first phase value. Additionally, the method may include outputting, by the controller, a second plurality of outgoing pulses, each pulse of the second plurality of outgoing pulses having one of the three pulse values. Further, the method may include outputting, by the controller, a second plurality of phase pulses indicative of a phase of the second plurality of outgoing pulses, each phase pulse of the second plurality of phase pulses having a second phase value.

In yet another embodiment, an electronic device may include a controller outputting a plurality of outgoing pulses and a plurality of phase pulses. The electronic device may also include a transmitter including a phase locked loop coupled to the controller, the phase locked loop outputting a first clock signal with a first phase based on the plurality of phase pulses having a first value and outputting a second clock signal with a second phase based on the plurality of phase pulses having a second value. Additionally, the transmitter may include a first modulator coupled to the controller and the phase locked loop, the first modulator generating first output data signal with the first phase based on the plurality of outgoing pulses and the first clock signal, the first modulator generating the first output data signal with the second phase based on the plurality of outgoing pulses and the second clock signal. The transmitter may also include a first power amplifier coupled to the first modulator, the first power amplifier generating first amplified output data signal based on the first output data signal. Further, the transmitter may include a power combiner coupled to the first power amplifier that generates output signals based on the first amplified output data signal.

Various refinements of the features noted above may exist in relation to various aspects of the present disclosure. Further features may also be incorporated in these various aspects as well. These refinements and additional features may exist individually or in any combination. For instance, various features discussed below in relation to one or more of the illustrated embodiments may be incorporated into any of the above-described aspects of the present disclosure alone or in any combination. The brief summary presented above is intended only to familiarize the reader with certain aspects and contexts of embodiments of the present disclosure without limitation to the claimed subject matter.

BRIEF DESCRIPTION OF THE DRAWINGS

Various aspects of this disclosure may be better understood upon reading the following detailed description and upon reference to the drawings described below in which like numerals refer to like parts.

DETAILED DESCRIPTION OF SPECIFIC EMBODIMENTS

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. Furthermore, the particular features, structures, or characteristics may be combined in any suitable manner in one or more embodiments. Use of the terms "approximately," "near," "about," "close to," and/or "substantially" should be understood to mean including close to a target (e.g., design, value, amount), such as within a margin of any suitable or contemplatable error (e.g., within 0.1% of a target, within 1% of a target, within 5% of a target, within 10% of a target, within 25% of a target, and so on). Moreover, it should be understood that any exact values, numbers, measurements, and so on, provided herein, are contemplated to include approximations (e.g., within a margin of suitable or contemplatable error) of the exact values, numbers, measurements, and so on. Additionally, the term "set" may include one or more. That is, a set may include a unitary set of one member, but the set may also include a set of multiple members.

This disclosure is directed to a transmitter including a phase locked loop (PLL), a modulator, a power amplifier (PA), and a power combiner. A controller including programmable and/or hardened logic circuitry may be couple to the PLL and the modulator. The controller may provide encoded signals based on quadrature phase shift keying (QPSK) scheme for transmission by the transmitter. In particular, the controller may provide strings of pulses indicative of data packets to the modulator. Moreover, the controller may provide instructions indicative of generating clock signals with in-phase and quadrature phases to the PLL.

The PLL may generate and provide the clock signals with a phase difference. For example, the PLL may generate a first clock signal having a reference phase and a second clock signal having a delayed phase lagging by a phase value (e.g., −90°). The PLL may provide the first clock signal and the second clock signal to the modulator and the PA. Moreover, the modulator may generate data packets based on receiving the strings of pulses from the controller and clock signals. In particular, the modulator may generate and provide in-phase data packets and quadrature data packets based on a phase of the received clock signal (e.g., based on receiving the first clock signal or the second clock signal) to the PA. As such, the PA may provide an amplified output data signal to the antenna, where the amplified output data signal may include bursts of in-phase output data signal or quadrature output data signal.

With the foregoing in mind, the controller may provide each string of pulses with either in-phase (e.g., 0°) or quadrature (e.g., delayed by −90°) phase for transmission. That is, the controller may provide each string of pulses to the modulator when instructing the PLL to either provide the first clock signal corresponding to in-phase data packets (e.g., 0°) or provide the second clock signal corresponding to the quadrature data packets (e.g., delayed by −90°). The controller may also provide a guard interval time between each string of pulses to reduce interference between different strings of pulses having different phases during modulation before amplification by the PA.

Figure 1:
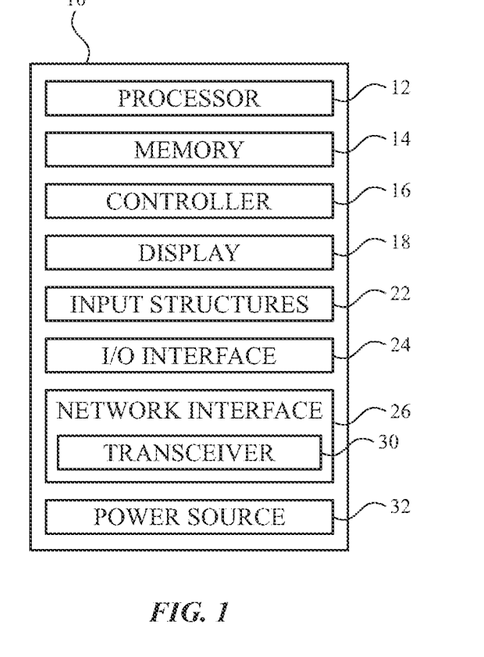
FIG. 1 is a block diagram of an electronic device, according to embodiments of the present disclosure.

FIG. 1 is a block diagram of an electronic device 10, according to embodiments of the present disclosure. The electronic device 10 may include, among other things, one or more processors 12 (collectively referred to herein as a single processor for convenience, which may be implemented in any suitable form of processing circuitry), memory 14 (and/or nonvolatile storage), a controller 16, a display 18, input structures 22, an input/output (I/O) interface 24, a network interface 26, and a power source 32. In different embodiments, the controller 16 may include at least a portion of the processor 12, one or more programmable logic circuits, one or more hardened logic circuits, or a combination thereof, among other things.

The various functional blocks shown in FIG. 1 may include hardware elements (including circuitry), software elements (including machine-executable instructions) or a combination of both hardware and software elements (which may be referred to as logic). The processor 12, memory 14 (and/or the nonvolatile storage), the controller 16, the display 18, the input structures 22, the input/output (I/O) interface 24, the network interface 26, and/or the power source 32 may each be communicatively coupled directly or indirectly (e.g., through or via another component, a communication bus, a network) to one another to transmit and/or receive signals between one another. It should be noted that FIG. 1 is merely one example of a particular implementation and is intended to illustrate the types of components that may be present in the electronic device 10.

By way of example, the electronic device 10 may include any suitable computing device, including a desktop or notebook computer, a portable electronic or handheld electronic device such as a wireless electronic device or smartphone, a tablet, a wearable electronic device, and other similar devices. In additional or alternative embodiments, the electronic device 10 may include an access point, such as a base station, a router (e.g., a wireless or Wi-Fi router), a hub, a switch, and so on. It should be noted that the processor 12, the controller 16, and other related items in FIG. 1 may be embodied wholly or in part as software, hardware, or both. Furthermore, the processor 12, the controller 16, and other related items in FIG. 1 may be a single contained processing module or may be incorporated wholly or partially within any of the other elements within the electronic device 10. The processor 12 and the controller 16, individually or in combination, may be implemented with any combination of general-purpose microprocessors, microcontrollers, digital signal processors (DSPs), field programmable gate array (FPGAs), programmable logic devices (PLDs), controllers, state machines, gated logic, discrete hardware components, dedicated hardware finite state machines, or any other suitable entities that may perform calculations or other manipulations of information. The processors 12 may include one or more application processors, one or more baseband processors, or both, and perform the various functions described herein.

In the electronic device 10 of FIG. 1, the processor 12 and the controller 16 may be operably coupled with a memory 14 (and/or the nonvolatile storage) to perform various algorithms. Such programs or instructions executed by the processor 12 and/or the controller 16 may be stored in any suitable article of manufacture that includes one or more tangible, computer-readable media. The tangible, computer-readable media may include the memory 14 (and/or the nonvolatile storage), individually or collectively, to store the instructions or routines.

The memory 14 (and/or the nonvolatile storage) may include any suitable articles of manufacture for storing data and executable instructions, such as random-access memory, read-only memory, rewritable flash memory, hard drives, and optical discs. In addition, programs (e.g., an operating system) encoded on such a computer program product may also include instructions that may be executed by the processor 12 and/or the controller 16 to enable the electronic device 10 to provide various functionalities. Moreover, in some embodiments, the controller 16 may implement register transfer level (RTL) code stored on and/or retrieved from the memory 14 (and/or the nonvolatile storage) to enable the electronic device 10 to provide various functionalities.

In certain embodiments, the display 18 may facilitate users to view images generated on the electronic device 10. In some embodiments, the display 18 may include a touch screen, which may facilitate user interaction with a user interface of the electronic device 10. Furthermore, it should be appreciated that, in some embodiments, the display 18 may include one or more liquid crystal displays (LCDs), light-emitting diode (LED) displays, organic light-emitting diode (OLED) displays, active-matrix organic light-emitting diode (AMOLED) displays, or some combination of these and/or other display technologies.

The input structures 22 of the electronic device 10 may enable a user to interact with the electronic device 10 (e.g., pressing a button to increase or decrease a volume level). The I/O interface 24 may enable electronic device 10 to interface with various other electronic devices, as may the network interface 26. In some embodiments, the I/O interface 24 may include an I/O port for a hardwired connection for charging and/or content manipulation using a standard connector and protocol, such as the Lightning connector, a universal serial bus (USB), or other similar connector and protocol. The network interface 26 may include, for example, one or more interfaces for a personal area network (PAN), such as an ultra-wideband (UWB) or a BLUETOOTH® network, a local area network (LAN) or wireless local area network (WLAN), such as a network employing one of the IEEE 802.11x family of protocols (e.g., WI-FI®), and/or a wide area network (WAN), such as any standards related to the Third Generation Partnership Project (3GPP), including, for example, a $3^{rd}$ generation (3G) cellular network, universal mobile telecommunication system (UMTS). $4^{th}$ generation (4G) cellular network. Long Term Evolution® (LTE) cellular network. Long Term Evolution License Assisted Access (LTE-LAA) cellular network. $5^{th}$ generation (5G) cellular network, and/or New Radio (NR) cellular network, a $6^{th}$ generation (6G) or greater than 6G cellular network, a satellite network, a non-terrestrial network, and so on. In particular, the network interface 26 may include, for example, one or more interfaces for using a cellular communication standard of the 5G specifications that include the millimeter wave (mmWave) frequency range (e.g., 24.25-300 gigahertz (GHz)) that defines and/or enables frequency ranges used for wireless communication. The network interface 26 of the electronic device 10 may allow communication over the aforementioned networks (e.g., 5G, Wi-Fi, LTE-LAA, and so forth).

The network interface 26 may also include one or more interfaces for, for example, broadband fixed wireless access networks (e.g., WIMAX®), mobile broadband Wireless networks (mobile WIMAX®), asynchronous digital subscriber lines (e.g., ADSL, VDSL), digital video broadcasting-terrestrial (DVB-T®) network and its extension DVB Handheld (DVB-H®) network, UWB network, alternating current (AC) power lines, and so forth.

As illustrated, the network interface 26 may include a transceiver 30. In some embodiments, all or portions of the transceiver 30 may be disposed within or coupled to the processor 12 and/or the controller 16. The transceiver 30 may support transmission and receipt of various wireless signals via one or more antennas, and thus may include a transmitter and a receiver. The power source 32 of the electronic device 10 may include any suitable source of power, such as a rechargeable lithium polymer (Li-poly) battery and/or an alternating current (AC) power converter.

Figure 2:
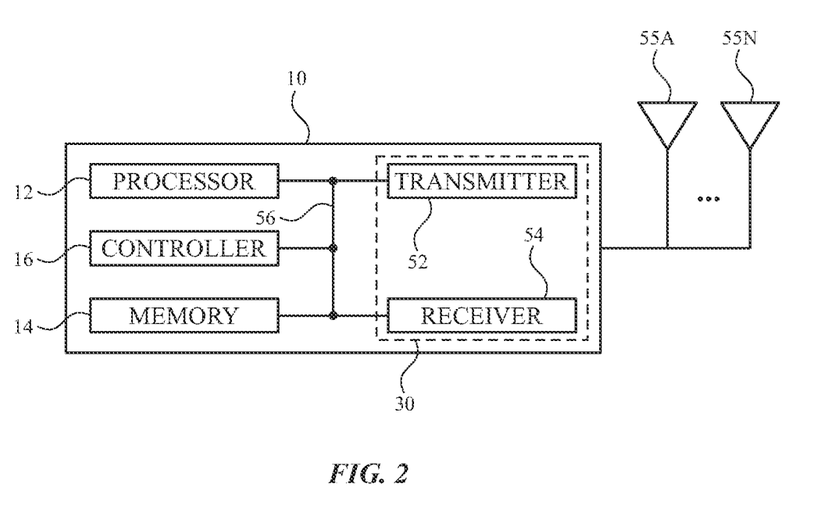
FIG. 2 is a functional diagram of the electronic device of FIG. 1, according to embodiments of the present disclosure.

FIG. 2 is a functional diagram of the electronic device 10 of FIG. 1, according to embodiments of the present disclosure. As illustrated, the processor 12, the memory 14, the controller 16, the transceiver 30, a transmitter 52, a receiver 54, and/or antennas 55 (illustrated as 55A-55N, collectively referred to as an antenna 55) may be communicatively coupled directly or indirectly (e.g., through or via another component, a communication bus, a network) to one another to transmit and/or receive signals between one another.

The electronic device 10 may include the transmitter 52 and/or the receiver 54 that respectively enable transmission and reception of signals between the electronic device 10 and an external device via, for example, a network (e.g., including base stations or access points) or a direct connection. As illustrated, the transmitter 52 and the receiver 54 may be combined into the transceiver 30. The electronic device 10 may also have one or more antennas 55A-55N electrically coupled to the transceiver 30. The antennas 55A-55N may be configured in an omnidirectional or directional configuration, in a single-beam, dual-beam, or multi-beam arrangement, and so on. Each antenna 55 may be associated with one or more beams and various configurations. In some embodiments, multiple antennas of the antennas 55A-55N of an antenna group or module may be communicatively coupled to a respective transceiver 30 and each emit radio frequency signals that may constructively and/or destructively combine to form a beam. The electronic device 10 may include multiple transmitters, multiple receivers, multiple transceivers, and/or multiple antennas as suitable for various communication standards. In some embodiments, the transmitter 52 and the receiver 54 may transmit and receive information via other wired or wireline systems or means.

As illustrated, the various components of the electronic device 10 may be coupled together by a bus system 56. The bus system 56 may include a data bus, for example, as well as a power bus, a control signal bus, and a status signal bus, in addition to the data bus. The components of the electronic device 10 may be coupled together or accept or provide inputs to each other using some other mechanism.

Figure 3:
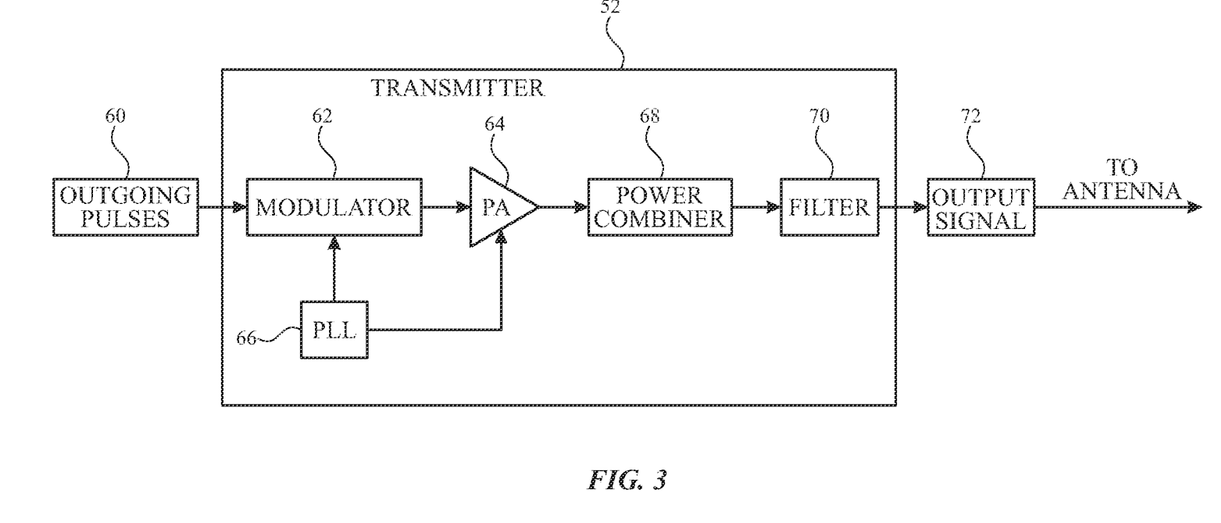
FIG. 3 is a schematic diagram of a transmitter of the electronic device of FIG. 1, according to embodiments of the present disclosure.

FIG. 3 is a schematic diagram of the transmitter 52 (e.g., transmit circuitry), according to embodiments of the present disclosure. As illustrated, the transmitter 52 may receive outgoing pulses 60 in the form of a digital signal to be transmitted via the one or more antennas 55.

A modulator 62 may receive and combine outgoing pulses 60 (e.g., the digital signal) with a carrier signal to generate output data signal (e.g., digital output data signal). In some embodiments, the modulator 62 may also convert a frequency of the digital signal (e.g., perform clock crossing) when the transmitter 52 provides output signals 74 (e.g., transmission signals) with a different frequency compared a frequency of the outgoing pulses 60. A power amplifier (PA) 64 may receive the output data signal from the modulator 62. In specific cases, the PA 64 may include a digital PA. Alternatively or additionally, the PA 64 may include any other viable PA (e.g., a linear PA). The PA 64 may amplify the output data signal to a suitable level to drive transmission of the output signals 74 via the one or more antennas 55.

The transmitter 52 may include a power combiner 68 to combine two or more power amplifier output signals (e.g., analog signals, radio waves). Moreover, in some embodiments, a filter 70 (e.g., filter circuitry and/or software) of the transmitter 52 may then remove undesirable noise from the combined signal to generate output signals 74 to be transmitted via the one or more antennas 55. The filter 70 may include any suitable filter or filters to remove the undesirable noise from the amplified signal, such as a bandpass filter, a bandstop filter, a low pass filter, a high pass filter, and/or a decimation filter. In some embodiments, the power combiner 68 and/or the filter 70 may effectively act as a digital-to-analog converter (e.g., by converting an input amplified digital signal to an output analog signal).

The transmitter 52 may be referred to as part of a radio frequency front end (RFFE), and more specifically, a transmit front end (TXFE) of the electronic device 10. Additionally, the transmitter 52 may include any suitable additional components not shown, or may not include certain of the illustrated components, such that the transmitter 52 may transmit the outgoing pulses 60 via the one or more antennas 55. For example, the transmitter 52 may include a mixer and/or a digital up converter. Moreover, in some embodiments, the PA 64 may include the power combiner 68 and/or the filter 70. In such embodiments, the transmitter 52 may not include a separate power combiner 68 and/or a separate filter 70.

Figure 4A:
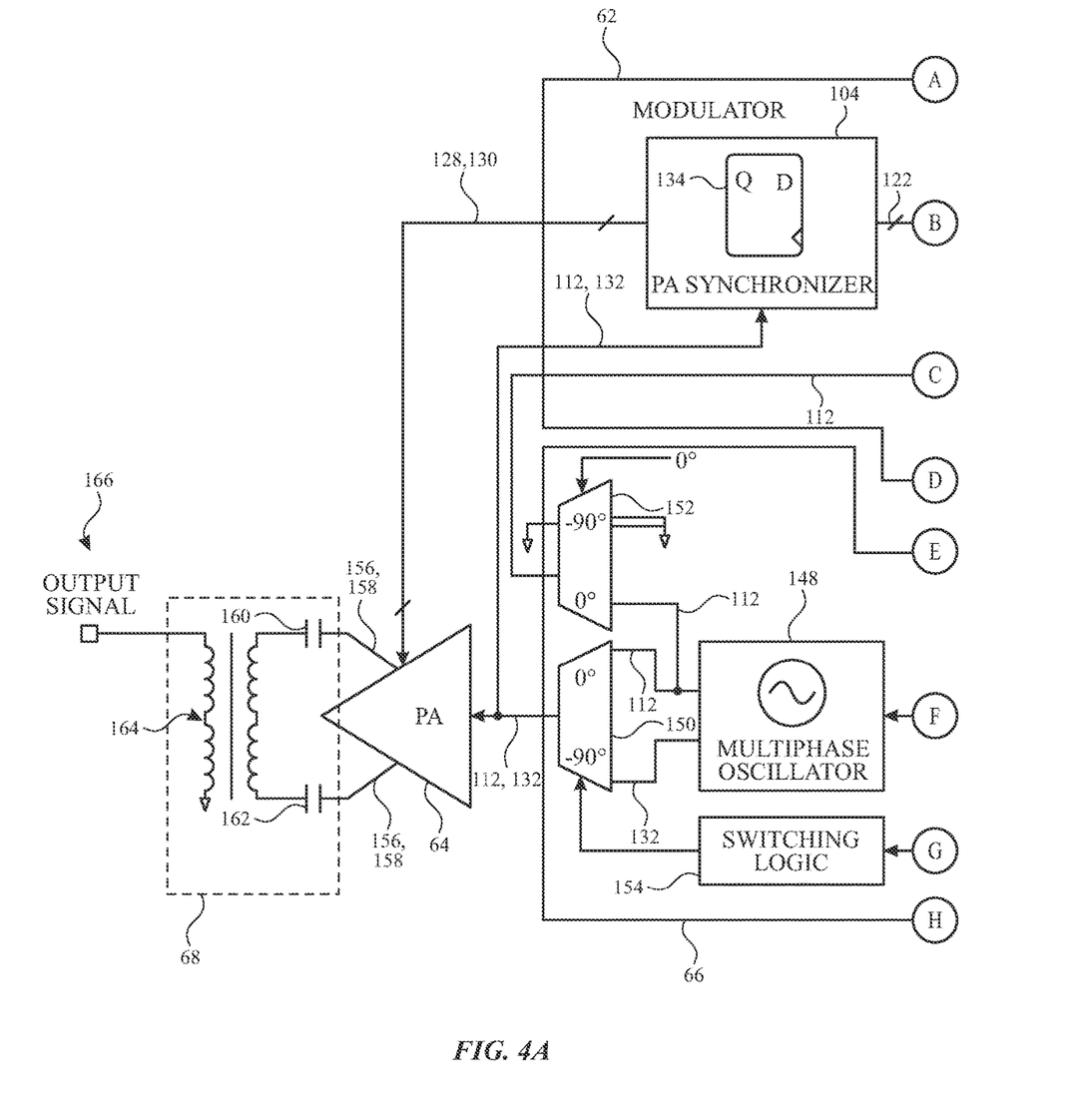
FIG. 4A is a first portion of a block diagram of a first embodiment of the transmitter of FIG. 3 including a modulator, a power amplifier, a phase locked loop, and a power combiner, according to embodiments of the present disclosure.
Figure 4B:
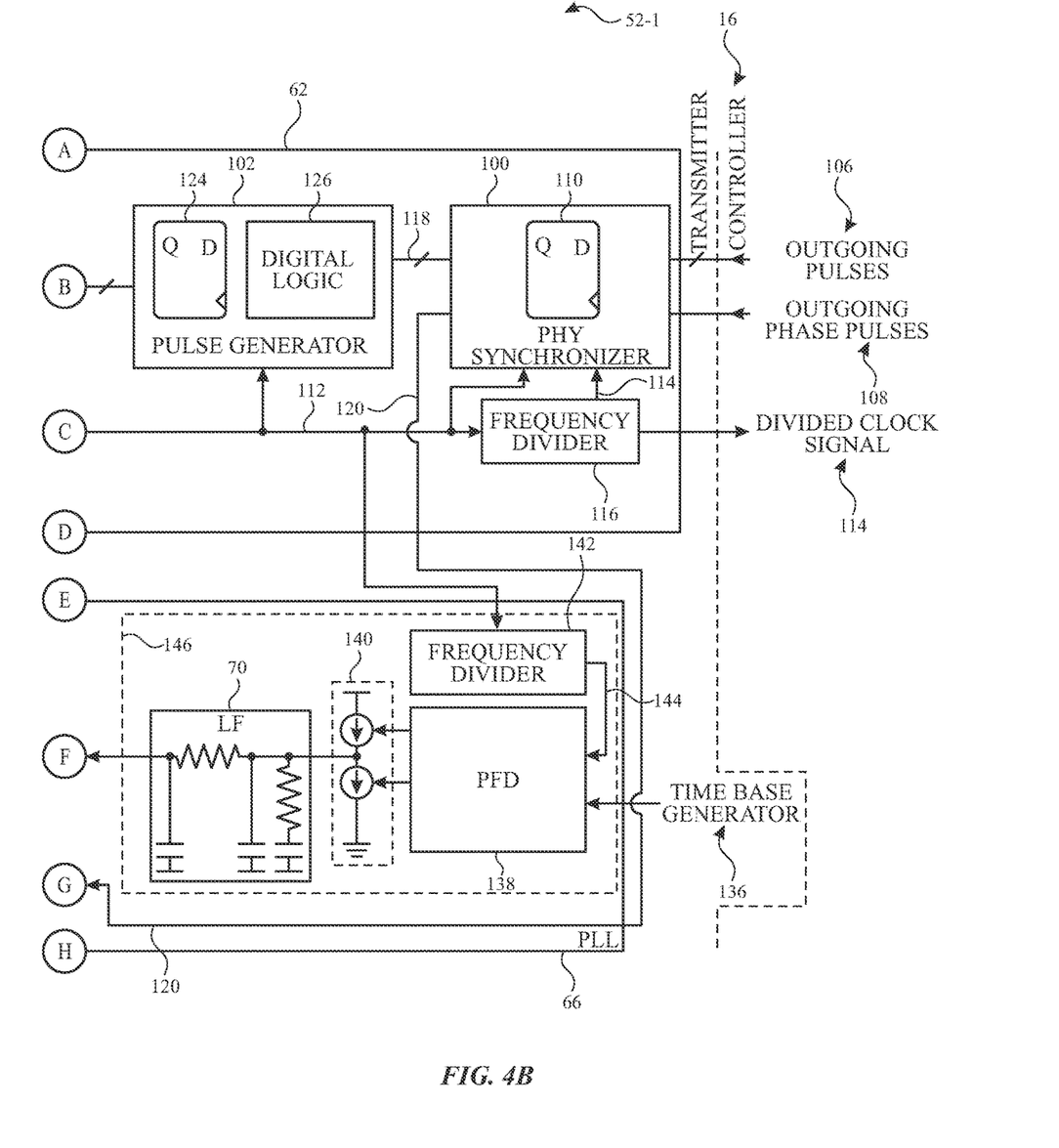
FIG. 4B is a second portion of the block diagram of FIG. 4A associated with the first embodiment of the transmitter of FIG. 3, according to embodiments of the present disclosure.

FIGS. 4A and 4B depict a first embodiment 52-1 of the transmitter 52 including the modulator 62, the PA 64, the PLL 66 and the power combiner 68. In the depicted embodiment, the transmitter 52-1 may couple to the controller 16. As mentioned above, the controller 16 may include the processor 12, one or more digital signal processors, one or more programmable logic circuits, one or more hardened logic circuits, or a combination thereof, among other things. FIGS. 4A and 4B are described in association with each other herein as depicting the first embodiment 52-1 of the transmitter 52.

The modulator 62 may include an input synchronizer 100 (e.g., a controller synchronizer), a pulse generator 102, and an output synchronizer 104 (e.g., a PA synchronizer). The input synchronizer 100 may couple to the controller 16 to receive outgoing pulses 106 (e.g., transmission pulses, a burst or string of pulses, eight pulses, sixteen pulses, thirty two pulses, and so on) and outgoing phase pulses 108 from the controller 16. For example, the controller 16 may execute instructions (e.g., hardware instructions, software instructions) stored in a tangible, non-transitory, computer-readable medium, such as the memory 14 (and/or the non-volatile storage) to output the outgoing pulses 106 along with the outgoing phase pulses 108. The outgoing pulses 106 may be indicative of output data signal and/or output signals and the outgoing phase pulses 108 may indicate a phase for providing the output data signal and/or the output signals, as will be appreciated.

For example, the controller 16 may output the outgoing pulses 106 in bursts (or strings) separated by guard time intervals to reduce interference between the pulses during modulation. Moreover, the controller 16 may output the outgoing phase pulses 108 indicative of a phase for providing each packet of the output data signal and/or the output signals associated with each of the bursts (or strings) of the outgoing pulses 106 based on an encoding scheme (e.g., Quadrature phase shift keying (QPSK) scheme). In some embodiments, each burst of outgoing pulses 106 may correspond to outgoing phase pulses 108 having a single value corresponding to either of the in-phase and quadrature component of the QPSK scheme. In some cases, the processor 12 discussed above may output the outgoing pulses 106 and/or the outgoing phase pulses 108 or output an indication of the outgoing pulses 106 and/or the outgoing phase pulses 108 to the controller 16 and/or the modulator 62.

The input synchronizer 100 may include one or more first-in first-out circuits (FIFOs) and/or flip-flops 110, hereinafter collectively referred to as a FIFO 110, though these flip-flops or other flip-flops disclosed herein may be replaced with any suitable latching circuitry. For example, the controller 16 may output the outgoing pulses 106 and/or the outgoing phase pulses 108 with a clock rate different from a clock rate (e.g., clock frequency) of the transmitter 52-1 to the FIFO 110. The FIFO 110 may convert (e.g., cross) a clock rate associated with receiving the outgoing pulses 106 and/or the outgoing phase pulses 108 from the controller 16 to a clock rate of the transmitter 52-1.

In the depicted embodiment, the input synchronizer 100 may receive a clock signal 112 from the PLL 66 and a divided clock signal 114 from a first frequency divider 116 coupled to the PLL 66. For example, the first frequency divider 116 may reduce a frequency of the clock signal 112 having a relatively high frequency (e.g., higher than 1 GHz, higher than 5 GHz, higher than 8 GHZ, and so on) to provide the divided clock signal 114 having a relatively lower frequency (e.g., less than 2 GHZ, equal to or less than 512 megahertz (MHz), equal to or less than 128 MHz, and so on). The clock signal 112 may have a clock rate corresponding to a transmission frequency of the transmitter 52-1 and the divided clock signal 114 may have a clock rate corresponding to an operation frequency of the controller 16.

As such, the FIFO 110 may receive (e.g., clock-in) the outgoing pulses 106 and/or the outgoing phase pulses 108 based on the clock rate of the divided clock signal 114 corresponding to a frequency of the controller 16 for providing the outgoing pulses 106 and/or the outgoing phase pulses 108. Moreover, the FIFO 110 may output (e.g., clock-out) the received outgoing pulses 106 and/or the outgoing phase pulses 108 based on the clock rate of the clock signal 112 corresponding to the transmission frequency of the transmitter 52-1. The first frequency divider 116 may also output the divided clock signal 114 to the controller 16. In some cases, the controller 16 may adjust or align an edge (e.g., a rising edge, a falling edge) of the outgoing pulses 106 and/or the outgoing phase pulses 108 with the divided clock signal 114.

In some embodiments, the FIFO 110 may also convert parallel bursts of the outgoing pulses 106 and/or the outgoing phase pulses 108 to series bursts of the outgoing pulses 118 and/or series bursts of the outgoing phase pulses 120. For example, the controller 16 may output outgoing pulses 106 and/or the outgoing phase pulses 108 in parallel. The FIFO 110 may convert the parallel bursts of outgoing pulses 106 and/or the parallel bursts of outgoing phase pulses 108 to series bursts of outgoing pulses 118 and/or the series bursts of outgoing phase pulses 120 respectively. Alternatively or additionally, the controller 16 may output the bursts of the outgoing pulses 106 and/or bursts of the outgoing phase pulses 108 in series to the FIFO 110 of the input synchronizer 100.

In any case, the input synchronizer 100 may output the series bursts of outgoing pulses 106 based on the clock rate of the transmission frequency to the pulse generator 102. Moreover, the input synchronizer 100 may output the series bursts of outgoing phase pulses 120 based on the clock rate of the transmission frequency to the PLL 66, as will be appreciated. In specific embodiments, each series bursts of outgoing pulses 106 may have a single phase (e.g., in-phase or quadrature phase of the QPSK scheme). It should also be appreciated that in some embodiments the FIFO 110 may also delay the outgoing pulses 106 to perform clock rate conversion, parallel to series conversion of the received pulses, among other things. Moreover, the input synchronizer 100 may include any other viable circuit component to perform the operations discussed above.

The pulse generator 102 may generate output data signal 122 (e.g., packets of data, data bytes, data words, data doublewords, and so on) by modulating (e.g., convolving) the series bursts of outgoing pulses 118 with a quantized waveform. The quantized waveform may include multiple pulses forming a pulse shape (e.g., a rising and falling wave). Alternatively or additionally, the pulses of the quantized waveform may form any other viable shape. As shown in the depicted embodiment, the pulse generator 102 may receive the clock signal 112 from the PLL 66. As such, the pulse generator 102 may modulate (e.g., convolve) the series bursts of outgoing pulses 118 with the quantized waveform based on the clock rate of the transmission frequency when receiving the clock signal 112.

In some embodiments, the pulse generator 102 may include multiple flip-flops 124 and programmable logic circuitry, hardened logic circuitry, processing circuitry, or a combination thereof, among other things, collectively referred to as digital logic 126. Moreover, in some cases, the pulse generator 102 may retrieve the quantized waveform from the memory 14 (and/or the non-volatile storage) of the electronic device 10, from the flip-flops 124, or any other viable storage. For example, the pulse generator 102 may alter an amplitude of some data bits (e.g., individual pulses) of the series outgoing pulses 118 based on the modulation (e.g., convolution) to generate the output data signal 122. In any case, the pulse generator 102 may output the output data signal 122 (e.g., modulated series transmission data) based on the clock rate of the transmission frequency to the output synchronizer 104.

The output synchronizer 104 may output in-phase output data signal 128 and quadrature output data signal 130 to the PA 64 based on receiving the output data signal 122. For example, the in-phase output data signal 128 may correspond to in-phase digital components of the QPSK scheme for generating I-signals. Moreover, the quadrature output data signal 130 may correspond to quadrature digital components of the QPSK scheme for generating Q-signals.

In the depicted embodiment, the output synchronizer may output the in-phase output data signal 128 based on receiving the clock signal 112 from the PLL 66. Moreover, the output synchronizer 104 may output the quadrature output data signal 130 based on receiving a delayed clock signal 132 from the PLL 66. As described in more detail below, the output synchronizer 104 may receive either the clock signal 112 or the delayed clock signal 132 based on a selector signal of a multiplexer (e.g., 150). Also mentioned above, the PLL 66 may generate the clock signal 112. The PLL 66 may also generate the delayed clock signal 132 based on receiving the series bursts of outgoing phase pulses 120 from the input synchronizer 100. The clock signal 112 and the delayed clock signal 132 may have a clock rate corresponding to the transmission frequency of the transmitter 52-1.

For example, the output synchronizer 104 may output the in-phase output data signal 128 corresponding to a phase of the received output data signal 122 when receiving the clock signal 112 (e.g., as selected by the multiplexer 150). Moreover, the output synchronizer 104 may output the quadrature output data signal 130 corresponding to a delayed phase of the received output data signal 122 when receiving the delayed clock signal 132 (e.g., as selected by the multiplexer 150). In some embodiments, the clock signal 112 may have a reference phase (e.g., 0°) for providing (e.g., clocking out) the in-phase output data signal 128. Moreover, the delayed clock signal 132 may have a quadrature phase delay (e.g., lags by −90°) compared to the reference phase. As such, the delayed clock signal 132 may be associated with providing (e.g., clocking out) the quadrature output data signal 130.

With the foregoing in mind, the output synchronizer 104 may include multiple flip-flops 134 outputting the in-phase output data signal 128 when receiving the clock signal 112 or outputting the quadrature output data signal 130 when receiving the delayed clock signal 132. For example, the flip-flops 134 may output the received output data signal 122 in response to receiving a rising edge, a falling edge, or both of the clock signal 112 or the delayed clock signal 132. Moreover, the PLL 66 may output either of the clock signal 112 or the delayed clock signal 132 based on the series bursts of outgoing phase pulses 120. Accordingly, the output synchronizer 104 may output one or more packets of the in-phase output data signal 128, the quadrature output data signal 130, or both to the PA 64 based on receiving the clock signal 112 or the delayed clock signal 132 for outputting each packet.

The PLL 66 may be coupled to a time base generator 136 to receive a time base signal. For example, the time base generator 136 may include a crystal oscillator generating the time base signal with a frequency a fraction of the transmission frequency of the transmitter 52-1. In the depicted embodiment, the PLL 66 may include a phase/frequency detector (PFD) 138, a charge pump 140, and a loop filter 70. The PLL 66 may also include a second frequency divider 142 providing a feedback clock signal 144 having the fraction of the transmission frequency of the transmitter 52-1. The phase/frequency detector (PFD) 138 may receive the feedback clock signal 144 and the time base signal. The phase/frequency detector (PFD) 138 may adjust the phase of the PLL's output clock signal 112 via the charge pump 140 and loop filter 70 based on the feedback clock signal 144 and the time base signal. As such, the PLL 66 may generate the clock signal 112 and the delayed clock signal 132 with more stable and/or accurate phases. Moreover, the phase/frequency detector (PFD) 138, the charge pump 140, and the loop filter 70 may reduce a phase and/or frequency disturbance of the time base signal. In some embodiments, the phase/frequency detector (PFD) 138, the charge pump 140, the loop filter 70, and the second frequency divider 142 may be collectively referred to as a time base signal conditioner circuit 146.

The PLL 66 may also include a multiphase oscillator 148 to generate the clock signal 112 and the delayed clock signal 132 based on receiving the filtered feedback clock signal 144 and the time base signal. In some embodiments, the multiphase oscillator 148 may output the clock signal 112 and the delayed clock signal 132 differentially. In some cases, the multiphase oscillator 148 may multiply the filtered and phase adjusted time base signal by a multiplication factor to generate the clock signal 112 and the delayed clock signal 132. In any case, the multiphase oscillator 148 may output the clock signal 112 to a first input of a first multiplexer 150 and a first input of a second multiplexer 152. Moreover, the multiphase oscillator 148 may output the delayed clock signal 132 to a second input of the first multiplexer 150. Moreover, a second input of the second multiplexer 152 may be grounded.

In the depicted embodiment, the second multiplexer 152 may output the feedback clock signal 144 to the pulse generator 102, the first frequency divider 116, and the second frequency divider 142. In specific cases, the second multiplexer 152 may delay the clock signal 112 to generate the feedback clock signal 144. In such cases, the first multiplexer 150 and the second multiplexer 152 may output the clock signal 112 and the feedback clock signal 144 in synchronization. Alternatively or additionally, the PLL 66 may not include the second multiplexer 152, the multiphase oscillator 148 may directly output the feedback clock signal 144, or the PLL 66 may include a different circuit component to generate the feedback clock signal 144.

In the depicted embodiment, the PLL 66 may include a switching logic 154 (e.g., a glitch-free switching logic) coupled to the first multiplexer 150 and the input synchronizer 100. The switching logic 154 may receive the series bursts of outgoing phase pulses 120. The switching logic 154 may select a first output of the first multiplexer 150 corresponding to the first input of the first multiplexer 150 receiving the clock signal 112. In particular, the switching logic 154 may select the first output of the first multiplexer 150 when the series bursts of outgoing phase pulses 120 corresponds to in-phase digital components for generating I-signals of the QPSK scheme. As such, the switching logic 154 may select the first output of the first multiplexer 150 to output the clock signal 112 to the output synchronizer 104 and the PA 64. As such, the PA 64 may output amplified in-phase output data signal 156 based on receiving the clock signal 112 and the in-phase output data signal 128.

Moreover, the switching logic 154 may select the second output of the first multiplexer 150 when the series bursts of outgoing phase pulses 120 corresponds to quadrature digital components for generating Q-signals of the QPSK scheme. As such, the switching logic 154 may select the second output of the first multiplexer 150 to output the delayed clock signal 132 to the output synchronizer 104 and the PA 64. As such, the PA 64 may output amplified quadrature output data signal 158 based on receiving the clock signal 112 and the in-phase output data signal 128. With the foregoing in mind, it should be appreciated that the PLL 66 may include any other viable circuitry or different circuitry to generate the clock signal 112 and the delayed clock signal 132.

The PA 64 may output the amplified in-phase output data signal 156 and the amplified quadrature output data signal 158 to the power combiner 68. In some embodiments, the PA 64 may output the amplified in-phase output data signal 156 and the amplified quadrature output data signal 158 differentially to the power combiner 68. In the depicted embodiment, the power combiner 68 may include capacitors 160 and 162 and a balun 164 (e.g., inductive combiner). In any case, the power combiner 68 may generate output signals 166 in response to receiving the amplified in-phase output data signal 156 or the amplified quadrature output data signal 158 differentially. In some embodiments, the power combiner 68 may output the output signals 166 to the one or more antennas 55 for wireless transmission. In other embodiments, the power combiner 68 may output the output signals 166 to a filter 70. Alternatively or additionally, the power combiner 68 may provide the output signals 166 to other circuitry.

Figure 5A:
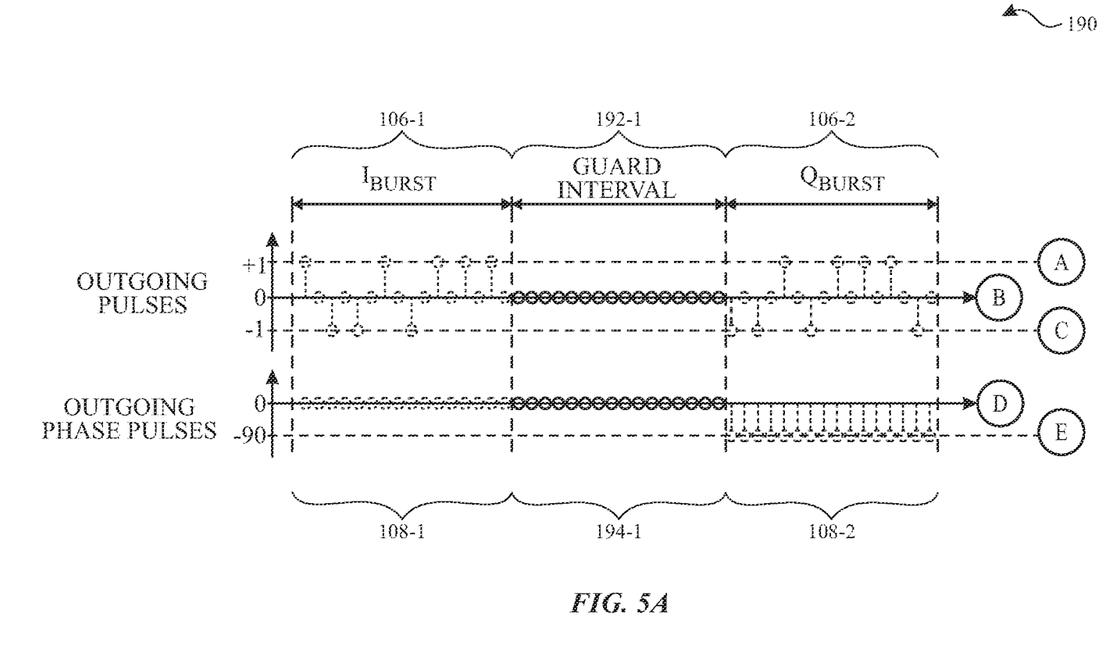
FIG. 5A is a first portion of a graph including examples of outgoing pulses and respective outgoing phase pulses for generating the output signals by the transmitter of FIGS. 4A and 4B based on a quadrature phase shift keying (QPSK) scheme, according to embodiments of the present disclosure.
Figure 5B:
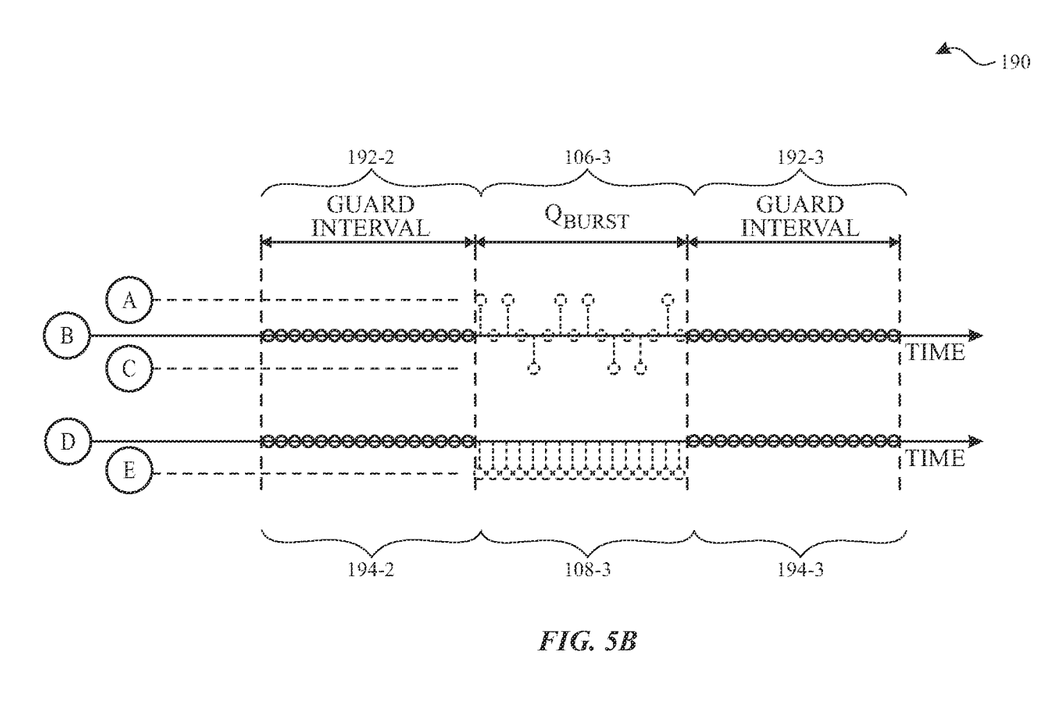
FIG. 5B is a second portion of the graph of FIG. 5A for generating the output signals by the transmitter of FIGS. 4A and 4B based on the QPSK scheme, according to embodiments of the present disclosure.

FIGS. 5A and 5B depict a graph 190 including examples of the outgoing pulses 106 and respective outgoing phase pulses 108 for generating the output signals 166 by the transmitter 52-1 discussed above. For example, the controller 16 may generate and/or output the depicted outgoing pulses 106 and the outgoing phase pulses 108 to the transmitter 52-1. FIGS. 5A and 5B are described in association with each other herein as depicting the graph 190 including examples of the outgoing pulses 106 and respective outgoing phase pulses 108.

In the depicted embodiment, the graph 190 may include a first burst of outgoing pulses 106-1 followed by a first guard interval 192-1, a first burst of outgoing phase pulses 108-1 followed by a first guard interval 194-1, a second burst of outgoing pulses 106-2 followed by a second guard interval 192-2, a second burst of outgoing phase pulses 108-2 followed by a second guard interval 194-2, a third burst of outgoing pulses 106-3 followed by a third guard interval 192-3, a third burst of outgoing phase pulses 108-3 followed by a third guard interval 194-3. In specific cases, the transmitter 52-1 may receive each burst of outgoing pulses 106 in synchronization (e.g., at a same time, at approximately same time) with receiving the respective burst of outgoing phase pulses 108. Although the outgoing pulses 106 and the outgoing phase pulses 108 are depicted in series, it should be appreciated that the controller 16 may alternatively or additionally output each of the outgoing pulses 106 and the outgoing phase pulses 108 in parallel.

The first burst of outgoing pulses 106-1 may be associated with the first burst of outgoing phase pulses 108-1. In particular, the first burst of outgoing pulses 106-1 and the first burst of outgoing phase pulses 108-1 may each include sixteen pulses. Each pulse of the first burst of outgoing pulses 106-1 may correspond to a respective pulse of the first burst of outgoing phase pulses 108-1. Moreover, the first burst of outgoing phase pulses 108-1 may include an amplitude corresponding to 0° phase (e.g., a reference phase). As such, the first burst of outgoing pulses 106-1 may correspond to in-phase digital components (e.g., I-signals) of the QPSK scheme. Accordingly, the first burst of outgoing phase pulses 108-1 may cause the transmitter 52-1 to generate the output signals 166 by providing a first data packet (e.g., the in-phase output data signal 128, the amplified in-phase output data signal 156) to the PA 64. For example, the first data packet may include data byte, a data word, a data doubleword, and so on.

Moreover, the second burst of outgoing pulses 106-2 may be associated with the second burst of outgoing phase pulses 108-2. In particular, the second burst of outgoing pulses 106-2 and the second burst of outgoing phase pulses 108-2 may each include sixteen pulses. Each pulse of the second burst of outgoing pulses 106-2 may correspond to a respective pulse of the second burst of outgoing phase pulses 108-2. Moreover, the second burst of outgoing phase pulses 108-2 may include an amplitude corresponding to −90° phase (e.g., −90° lag in phase compared to the reference phase). As such, the second burst of outgoing pulses 106-2 may correspond to quadrature digital components (e.g., Q-signals) of the QPSK scheme. Accordingly, the second burst of outgoing phase pulses 108-2 may cause the transmitter 52-1 to generate the output signals 166 by providing a second data packet (e.g., the quadrature output data signal 130, the amplified quadrature output data signal 158) to the PA 64. Similarly, the second data packet may include data byte, a data word, a data doubleword, and so on.

Furthermore, the third burst of outgoing pulses 106-3 may be associated with the third burst of outgoing phase pulses 108-3. In particular, the third burst of outgoing pulses 106-3 and the third burst of outgoing phase pulses 108-3 may each include sixteen pulses. Each pulse of the third burst of outgoing pulses 106-3 may correspond to a respective pulse of the third burst of outgoing phase pulses 108-3. Moreover, the third burst of outgoing phase pulses 108-3 may include the amplitude corresponding to −90° phase. As such, the third burst of outgoing pulses 106-3 may correspond to quadrature digital components (e.g., Q-signals) of the QPSK scheme. Accordingly, the third burst of outgoing phase pulses 108-3 may cause the transmitter 52-1 to generate the output signals 166 by providing a third data packet (e.g., the quadrature output data signal 130, the amplified quadrature output data signal 158) to the PA 64. Similarly, the third data packet may include data byte, a data word, a data doubleword, and so on.

In the depicted embodiment, each pulse of the first burst of outgoing pulses 106-1, the second burst of outgoing pulses 106-2, and the third burst of outgoing pulses 106-3 may have a positive value (e.g., +1), a negative value (e.g., −1), or a reference value (e.g., 0). In specific cases, each pulse of the first burst of outgoing pulses 106-1 may include a value based on binary phase shift keying (BPSK) scheme values. Moreover, all pulses of each of the first burst of outgoing phase pulses 108-1, the second burst of outgoing phase pulses 108-2, and the third burst of outgoing phase pulses 108-3 may have a first value corresponding to −90° or a second value corresponding to 0°. Accordingly, each pulse of the first burst of outgoing pulses 106-1, the second burst of outgoing pulses 106-2, and the third burst of outgoing pulses 106-3 may include a value based on QPSK scheme values.

Moreover, the guard intervals 192-1, 194-1, 192-2, 194-2, 192-3, and 194-3 may each include sixteen units of time corresponding to an equal time (e.g., approximately equal time) occupied by the sixteen pulses of the respective outgoing pulses 106 or the outgoing phase pulses 108. In alternative cases, each of the guard intervals 192-1, 194-1, 192-2, 194-2, 192-3, and 194-3 and bursts of the outgoing pulses 106 and/or the outgoing phase pulses 108 may include a different number of pulses. Moreover, each time unit and each pulse may occupy an equal number of clock cycles of a clock signal (e.g., the clock signal 112, a clock signal of the controller 16, and so on). Alternatively or additionally, each time unit occupied by each of the guard intervals 192-1, 194-1, 192-2, 194-2, 192-3, and 194-3 may correspond to a time unit occupied by each pulse of the outgoing pulses 106 and/or the outgoing phase pulses 108. In any case, each of the guard intervals 192-1, 194-1, 192-2, 194-2, 192-3, and 194-3 may occupy a number of units of time (e.g., clock cycles) equal to or higher than that of the corresponding bursts of the outgoing pulses 106 and/or the outgoing phase pulses 108. In specific cases, the controller 16 may output the outgoing pulses 106, the outgoing phase pulses 108, and/or the guard intervals 192-1, 194-1, 192-2, 194-2, 192-3, and 194-3 based on a standard (e.g., IEEE 802.15.4z Ultra-Wideband (UWB) standard).

In some embodiments, the first data packet corresponding to in-phase digital components (e.g., I-signals) and the second data packet corresponding to the quadrature digital components (e.g., Q-signals) may form two data packets based on the QPSK scheme. For example, the transmitter 52 may generate the output signals 166 based on the first data packet, the second data packet, the third data packet, and the respective time guards therebetween. Moreover, a receiver may receive the output signals 166 encoded based on the QPSK scheme. The receiver may determine (e.g., extract) the first data packet, the second data packet, and the third data packet by decoding the output signals 166. In some cases, the receiver may correspond a first data bit of the first data packet corresponding to in-phase digital components (e.g., I-signals) to a first data bit of the second data packet corresponding to quadrature digital components (e.g., Q-signals). That is, although the in-phase digital components and the quadrature digital components are transmitted in different data packets, the I-signals and the Q-signals may correspond to each other based on the QPSK scheme. Moreover, as discussed above, distinct transmission of the I-signals and the Q-signals in different data packets based on the guard intervals 192-1, 194-1, 192-2, 194-2, 192-3, and 194-3 may reduce interference, for example, during transmitter modulation. As such, the first data packet and the second data packet, generated based on the first burst of outgoing pulses 106-1 and the second burst of outgoing pulses 106-2, may correspond to two packets of data encoded based on the QPSK scheme. The third data packet may also correspond to a respective data packet not shown in FIGS. 5A and 5B for simplicity.

Figure 6:
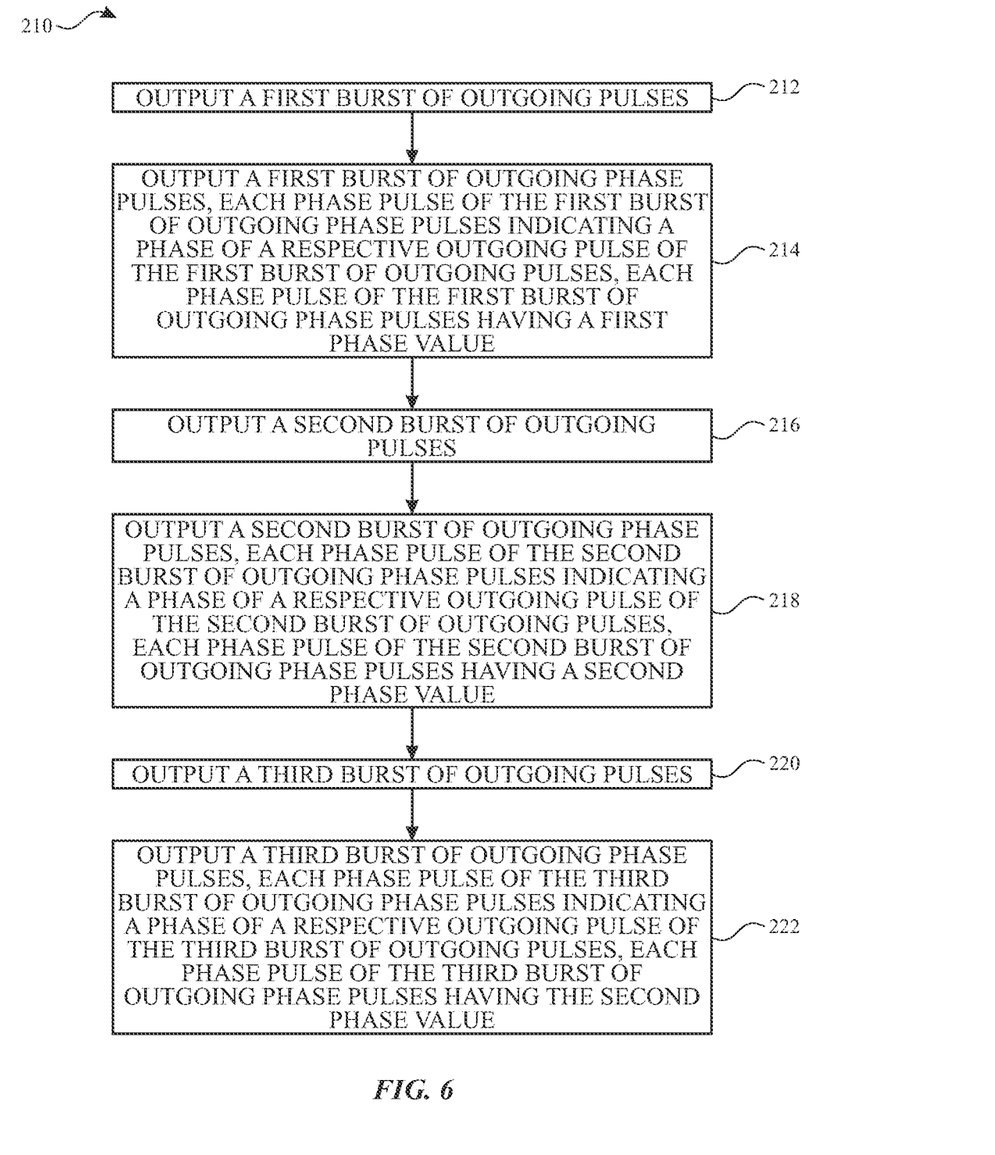
FIG. 6 is a flowchart of a method for the electronic device to generate in-phase and quadrature signals by using the transmitter of FIGS. 4A and 4B, according to embodiments of the present disclosure.

FIG. 6 is a flowchart of a method 210 for the electronic device 10 to generate in-phase and quadrature signals by using the transmitter 52-1 discussed above, according to embodiments of the present disclosure. Any suitable device that may control components of the electronic device 10, such as the processor 12 and/or the controller 16, may perform the method 210. In some embodiments, the method 210 may be implemented by executing instructions stored in a tangible, non-transitory, computer-readable medium, such as the memory 14 (and/or storage), using the processor 12 and/or the controller 16. For example, the method 210 may be performed at least in part by one or more software components, such as an operating system of the electronic device 10, one or more software applications of the electronic device 10, an implemented RTL code, soft or hardened logic circuitry, and the like. While the method 210 is described using steps in a specific sequence, it should be understood that the present disclosure contemplates that the described steps may be performed in different sequences than the sequence illustrated, and certain described steps may be skipped or not performed altogether.

In process block 212, the controller 16 outputs the first burst (e.g., group, string) of outgoing pulses 106-1. Each outgoing pulse of the first burst of outgoing pulses 106-1 may have a positive value (e.g., +1), a negative value (e.g., −1), or a reference value (e.g., 0). In process block 214, the controller 16 outputs the first burst of outgoing phase pulses 108-1. Each phase pulse of the first burst of outgoing phase pulses 108-1 may indicate a phase associated with a respective outgoing pulse of the first burst of outgoing pulses 106-1. Moreover, each phase pulse of the first burst of outgoing phase pulses 108-1 may have a first phase value. For example, each phase pulse of the first burst of outgoing phase pulses 108-1 may have the first phase value corresponding to 0°.

The transmitter 52-1 may receive the first burst of outgoing pulses 106-1 and the first burst of outgoing phase pulses 108-1. As such, the transmitter 52-1 may generate the in-phase output data signal 128 and/or the amplified in-phase output data signal 156. Accordingly, as discussed above, the transmitter 52-1 may generate the output signals 166 based on generating the in-phase output data signal 128 and/or the amplified in-phase output data signal 156.

In process block 216, the controller 16 outputs the second burst of outgoing pulses 106-2. Each outgoing pulse of the second burst of outgoing pulses 106-2 may have the positive value (e.g., +1), the negative value (e.g., −1), or the reference value (e.g., 0). In process block 218, the controller 16 outputs the second burst of outgoing phase pulses 108-2. Each phase pulse of the second burst of outgoing phase pulses 108-2 may indicate a phase associated with a respective outgoing pulse of the second burst of outgoing pulses 106-2. Moreover, each phase pulse of the second burst of outgoing phase pulses 108-2 may have the second phase value. For example, each phase pulse of the second burst of outgoing phase pulses 108-2 may have the second phase value corresponding to −90°.

The transmitter 52-1 may receive the second burst of outgoing pulses 106-2 and the second burst of outgoing phase pulses 108-2. As such, the transmitter 52-1 may generate the quadrature output data signal 130 and/or the amplified quadrature output data signal 158. Accordingly, as discussed above, the transmitter 52-1 may generate the output signals 166.

In process block 220, the controller 16 outputs the third burst of outgoing pulses 106-3. Each outgoing pulse of the third burst of outgoing pulses 106-3 may have the positive value (e.g., +1), the negative value (e.g., −1), or the reference value (e.g., 0). In process block 222, the controller 16 outputs the third burst of outgoing phase pulses 108-3. Each phase pulse of the third burst of outgoing phase pulses 108-3 may indicate a phase associated with a respective outgoing pulse of the third burst of outgoing pulses 106-3. Moreover, each phase pulse of the third burst of outgoing phase pulses 108-2 may have the second phase value. For example, each phase pulse of the third burst of outgoing phase pulses 108-3 may have the second phase value corresponding to −90°.

The transmitter 52-1 may receive the third burst of outgoing pulses 106-3 and the third burst of outgoing phase pulses 108-3. As such, the transmitter 52-1 may generate the quadrature output data signal 130 and/or the amplified quadrature output data signal 158. Accordingly, as discussed above, the transmitter 52-1 may generate the output signals 166.

Figure 7A:
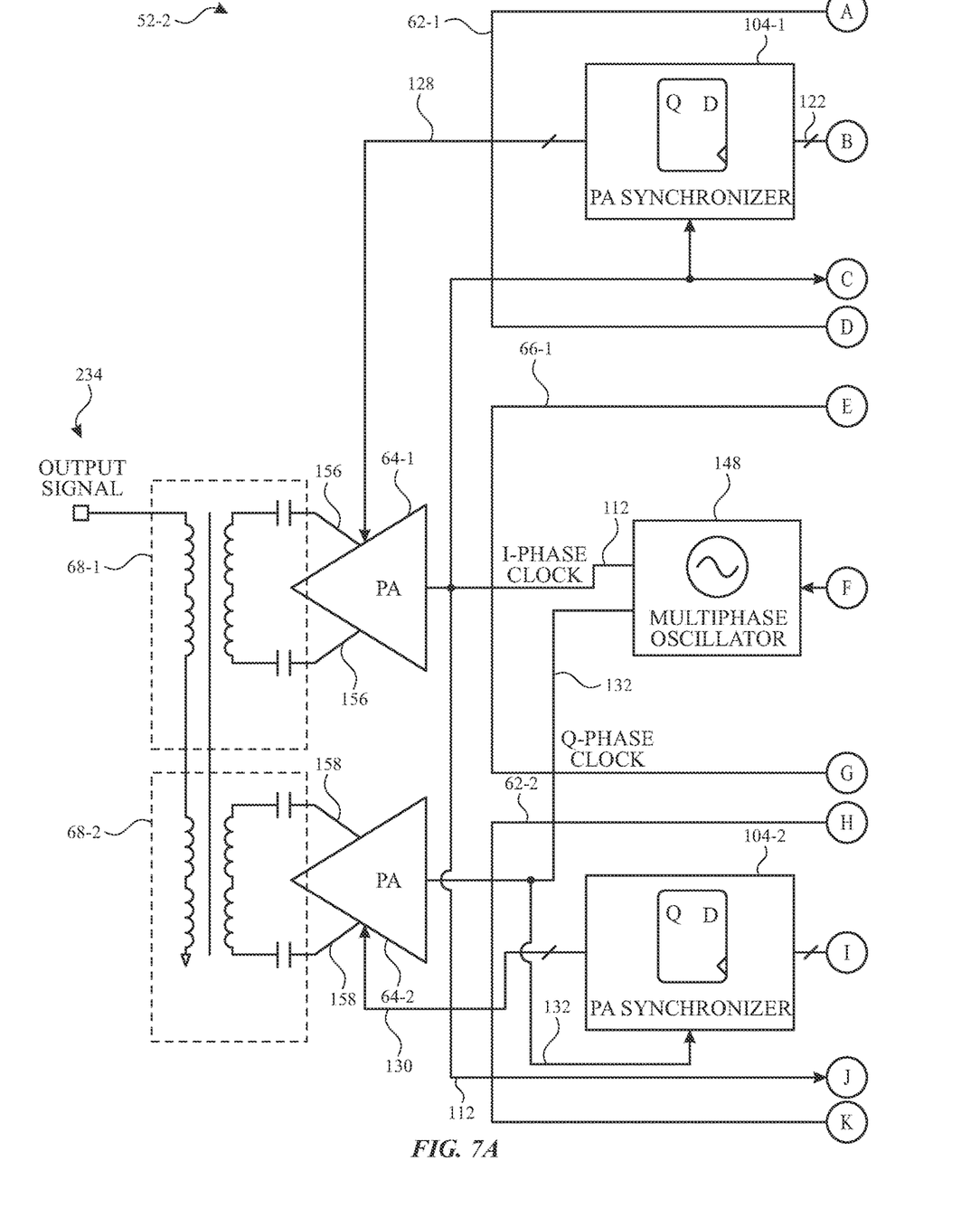
FIG. 7A is a first portion of a block diagram of a second embodiment of the transmitter of FIG. 3 including separate in-phase and quadrature modulation circuits, according to embodiments of the present disclosure.
Figure 7B:
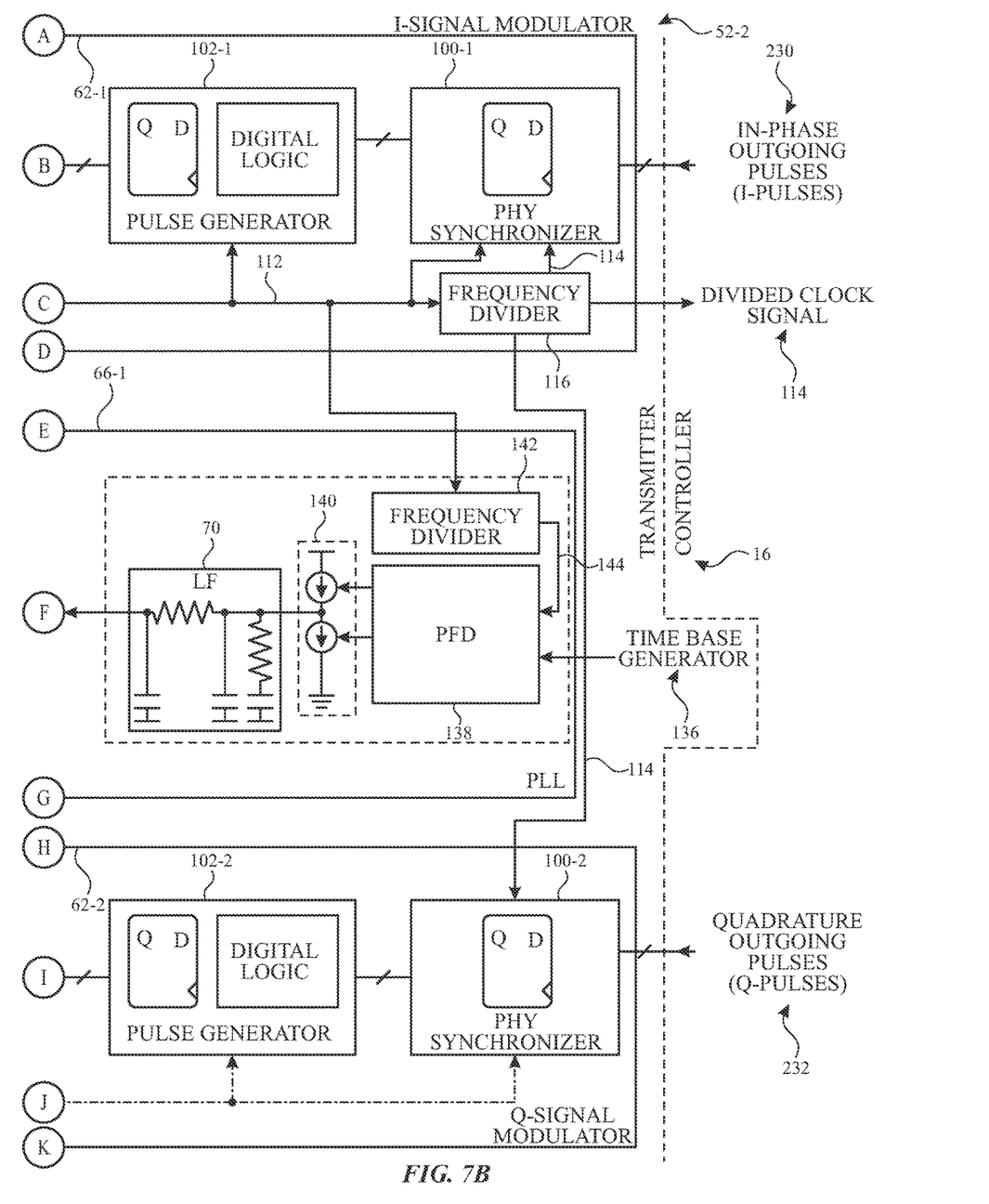
FIG. 7B is a second portion of the block diagram of FIG. 7A associated with the second embodiment of the transmitter of FIG. 3, according to embodiments of the present disclosure.

FIGS. 7A and 7B are a block diagram of a second embodiment 52-2 of the transmitter 52 including separate in-phase and quadrature modulation circuits. The transmitter 52-2 may include a first modulator 62-1, a second modulator 62-2, a shared PLL 66-1, a first PA 64-1, a second PA 64-2, a first power combiner 68-1, and a second power combiner 68-2. FIGS. 7A and 7B are described in association with each other herein as depicting the block diagram of the second embodiment 52-2 of the transmitter 52 including separate in-phase and quadrature modulation circuits.

The first modulator 62-1 may include an input synchronizer 100-1, a pulse generator 102-1, and an output synchronizer 104-1. The first modulator 62-1 may receive in-phase outgoing pulses 230 corresponding to in-phase components of the QPSK scheme. In some embodiments, the input synchronizer 100-1 may include similar (e.g., relatively similar) circuitry and/or perform similar (e.g., relatively similar) operations as the input synchronizer 100 discussed above. The pulse generator 102-1 may include similar (e.g., relatively similar) circuitry and/or perform similar (e.g., relatively similar) operations as the pulse generator 102 discussed above. Moreover, the output synchronizer 104-1 may include similar (e.g., relatively similar) circuitry and/or perform similar (e.g., relatively similar) operations as the output synchronizer 104 discussed above. As such, the first modulator 62-1 may output the in-phase output data signal 128 based on receiving the in-phase outgoing pulses 230. Alternatively or additionally, the first modulator 62-1 may include different circuitry.

Moreover, the second modulator 62-2 may include an input synchronizer 100-2, a pulse generator 102-2, and an output synchronizer 104-2. The second modulator 62-2 may receive quadrature outgoing pulses 232 of the outgoing pulses 106 from the controller 16. For example, a burst (e.g., string, group) of pulses may include one or more of the in-phase outgoing pulses 230 and one or more of the quadrature outgoing pulses 232. The controller 16 may output the one or more in-phase outgoing pulses 230 of the burst to the first modulator 62-1 discussed above and may output one or more quadrature outgoing pulses 232 of the burst to the second modulator 62-2.

In some embodiments, the input synchronizer 100-2 may include similar (e.g., relatively similar) circuitry and/or perform similar (e.g., relatively similar) operations as the input synchronizer 100 discussed above. The pulse generator 102-2 may include similar (e.g., relatively similar) circuitry and/or perform similar (e.g., relatively similar) operations as the pulse generator 102. Moreover, the output synchronizer 104-2 may include similar (e.g., relatively similar) circuitry and/or perform similar (e.g., relatively similar) operations as the output synchronizer 104 discussed above. As such, the second modulator 62-2 may output the quadrature output data signal 130 based on receiving the quadrature outgoing pulses 232. Moreover, the first modulator 62-1 and the second modulator 62-2 may share the first frequency divider 116 discussed above. Alternatively or additionally, the second modulator 62-2 may include different circuitry.

The PLL 66-1 may include the time base signal conditioner circuit 146 including the second frequency divider 142, the phase/frequency detector (PFD) 138, the charge pump 140, and the filter 70 (e.g., a loop filter), and the multiphase oscillator 148 discussed above. The PLL 66-1 may not include the first multiplexer 150 and the second multiplexer 152 discussed above based on the transmitter 52 including separate in-phase and quadrature modulation circuits (e.g., the first modulator 62-1 and the second modulator 62-2). Moreover, the first modulator 62-1 and the second modulator 62-2 may share the PLL 66-1.

The PLL 66-1 may generate the clock signal 112 and the delayed clock signal 132. The PLL 66-1 may output the clock signal 112 to the first frequency divider 116, the input synchronizer 100-1, the input synchronizer 100-2, the pulse generator 102-1, and the pulse generator 102-2. In the depicted embodiment, the first PA 64-1 may receive the clock signal 112 and the second PA 64-2 may receive the delayed clock signal 132. Moreover, the output synchronizer 104-1 may receive the clock signal 112 and the output synchronizer 104-2 may receive the delayed clock signal 132. As such, the output synchronizer 104-1 may output the in-phase output data signal 128 to the first PA 64-1. Moreover, the output synchronizer 104-2 may output the quadrature output data signal 130 to the second PA 64-2.

In some embodiments, the first PA 64-1 and the second PA 64-2 may include circuitry and/or circuit components similar to the PA 64 discussed above. Alternatively or additionally, the first PA 64-1 and the second PA 64-2 may each include different circuitry. In any case, the first PA 64-1 may output amplified in-phase output data signal 128 to the first power combiner 68-1. Moreover, the second PA 64-2 may output amplified quadrature output data signal 130 to the second power combiner 68-2. The first power combiner 68-1 and the second power combiner 68-2 may each include similar or different circuitry or circuit components as the power combiner 68 discussed above. In some embodiments, the first power combiner 68-1 and the second power combiner 68-2 may form the power combiner 68 discussed above. The first power combiner 68-1 and the second power combiner 68-2 may combine the received signals to generate in-phase and quadrature output signals 234, output signals 234 with increased output power (e.g., up to double the output power) based on using two PAs 64-1 and 64-2, or both. Accordingly, the transmitter 52-2 may generate the output signals 234.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ," it is intended that such elements are to be interpreted under 35 U.S.C. 112(f). However, for any claims containing elements designated in any other manner, it is intended that such elements are not to be interpreted under 35 U.S.C. 112(f).

It is well understood that the use of personally identifiable information should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users.

The invention claimed is:

1. A transmitter comprising:
    a phase locked loop comprising
        a multiphase oscillator configured to output a first clock signal with a first phase and a second clock signal having a second phase, and
        a multiplexer coupled to the multiphase oscillator, the multiplexer configured to output the first clock signal or the second clock signal:
    a modulator coupled to the multiplexer, the modulator configured to generate first output data signal with the first phase based on the first clock signal and generate second output data signal with the second phase based on the second clock signal; and
    a power amplifier coupled to the multiplexer and the modulator, the power amplifier configured to generate a first amplified output data signal based on the first output data signal, the power amplifier configured to generate a second amplified output data signal based on the second output data signal.

2. The transmitter of claim 1, wherein the multiphase oscillator is configured to generate the first clock signal and the second clock signal having a same frequency.

3. The transmitter of claim 1, wherein the second phase is delayed compared to the first phase by −90 degrees.

4. The transmitter of claim 1, wherein the phase locked loop comprises a time base signal conditioner circuit configured to generate the first clock signal and the second clock signal based on a time base signal.

5. The transmitter of claim 1, wherein the transmitter is coupled to a controller, the controller configured to provide outgoing pulses to the modulator and provide phase pulses corresponding to the outgoing pulses to the multiplexer.

6. The transmitter of claim 5, wherein the multiplexer is configured to output the first clock signal or the second clock signal based on the phase pulses.

7. The transmitter of claim 5, wherein the modulator comprises a pulse generator and an output synchronizer, the output synchronizer being coupled to the multiplexer.

8. The transmitter of claim 7, wherein the pulse generator is configured to generate an output data signal based on the first clock signal and the outgoing pulses.

9. The transmitter of claim 8, wherein the output synchronizer is configured to provide the first output data signal based on the output data signal and the first clock signal and provide the second output data signal based on the output data signal and the second clock signal.

10. The transmitter of claim 1, wherein the power amplifier is coupled to one or more antennas, the one or more antennas configured to transmit the first output data signal and the second output data signal.

11. A method comprising:
    outputting, by a controller, a first plurality of outgoing pulses, each pulse of the first plurality of outgoing pulses having one of three pulse values;
    outputting, by the controller, a first plurality of phase pulses indicative of a phase of the first plurality of outgoing pulses, each phase pulse of the first plurality of phase pulses having a first phase value;
    outputting, by the controller, a second plurality of outgoing pulses, each pulse of the second plurality of outgoing pulses having one of the three pulse values; and
    outputting, by the controller, a second plurality of phase pulses indicative of a phase of the second plurality of outgoing pulses, each phase pulse of the second plurality of phase pulses having a second phase value.

12. The method of claim 11, wherein the three pulse values comprise a positive value, a negative value, or a reference value.

13. The method of claim 11, wherein the first phase value corresponds to 0° phase and the second phase value corresponds to −90 phase.

14. The method of claim 11, wherein each pulse of the first plurality of phase pulses corresponds to a respective pulse of the first plurality of outgoing pulses.

15. The method of claim 11, comprising outputting, via the controller, the first plurality of outgoing pulses, the first plurality of phase pulses, the second plurality of outgoing pulses, and the second plurality of phase pulses to a transmitter, the transmitter configured to generate output signals based on the first plurality of outgoing pulses, the first plurality of phase pulses, the second plurality of outgoing pulses, and the second plurality of phase pulses.

16. The method of claim 15, wherein the transmitter is configured to output the output signals to one or more antennas for wireless transmission.

17. An electronic device comprising:
    a controller configured to output a plurality of outgoing pulses and a plurality of phase pulses; and
    a transmitter comprising
        a phase locked loop coupled to the controller, the phase locked loop configured to output a first clock signal with a first phase based on the plurality of phase pulses having a first value and output a second clock signal with a second phase based on the plurality of phase pulses having a second value, a first modulator coupled to the controller and the phase locked loop, the first modulator configured to generate first output data signal with the first phase based on the plurality of outgoing pulses and the first clock signal, the first modulator configured to generate the first output data signal with the second phase based on the plurality of outgoing pulses and the second clock signal, a first power amplifier coupled to the first modulator, the first power amplifier configured to generate first amplified output data signal based on the first output data signal, and a power combiner coupled to the first power amplifier, the power combiner configured to generate output signals based on the first amplified output data signal.

18. The electronic device of claim 17, wherein each pulse of the plurality of outgoing pulses comprises a positive value, a negative, value, or a reference value.

19. The electronic device of claim 18, wherein the plurality of phase pulses are indicative of the first phase.

20. The electronic device of claim 17, comprising a second modulator coupled to the controller and the phase locked loop, a second power amplifier coupled the second modulator, and the power combiner, the second modulator configured to generate a second output data signal, the second power amplifier configured to generate a second amplified output data signal based on the second output data signal, and the power combiner configured to combine the first amplified output data signal and the second amplified output data signal.

* * * * *